United States Patent
Mercer et al.

(10) Patent No.: US 6,781,450 B1
(45) Date of Patent: Aug. 24, 2004

(54) LOW-FREQUENCY AUTO-ZEROED AMPLIFIER

(75) Inventors: Mark J. Mercer, Tucson, AZ (US); Paul Ranucci, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/384,366

(22) Filed: Mar. 7, 2003

(51) Int. Cl.$^7$ ............................................. H03F 1/02
(52) U.S. Cl. ........................................... 330/9; 330/69
(58) Field of Search ............................. 330/9, 51, 69; 327/124, 307

(56) References Cited

U.S. PATENT DOCUMENTS

| | | | |
|---|---|---|---|
| 5,124,663 A | | 6/1992 | McEntarfer et al. ............ 330/9 |
| 5,565,813 A | * | 10/1996 | Connell et al. ................. 330/9 |
| 6,087,897 A | * | 7/2000 | Wang ............................. 330/9 |
| 6,198,266 B1 | | 3/2001 | Mercer ......................... 323/316 |
| 6,400,219 B1 | * | 6/2002 | Fayed ............................ 330/9 |
| 6,639,460 B1 | * | 10/2003 | Botker ........................... 330/9 |

\* cited by examiner

Primary Examiner—Henry Choe
(74) Attorney, Agent, or Firm—Darby & Darby P.C.; Matthew M. Gaffney

(57) ABSTRACT

The present invention is related to glitch reduction of the output of an auto-zero amplifier. The auto-zero amplifier may be used in a voltage regulator, and the glitch reduction in the auto-zero amplifier will result in reduced output ripple. The auto-zero amplifier stores an input offset during an auto-zero phase, so that the input offset can be corrected during an amplification phase. During the amplification phase, the gate-drain voltage of a first transistor is sampled onto a capacitor. During the auto-zero phase, the capacitor is used to maintain the same voltage across the gate-drain voltage of the first transistor that was present during the amplification phase. The capacitor maintains the gate-drain voltage during the auto-zero phase in order to compensate for the large step in voltage that would otherwise occur.

20 Claims, 6 Drawing Sheets

LOW-FREQUENCY AUTO-ZEROED AMPLIFIER

FIELD OF THE INVENTION

The present invention relates to the field of amplifiers, and, in particular, to an auto-zeroed amplifier that is suitable for low frequency applications such as a voltage regulator. The amplifier provides reduced output ripple in voltage regulator applications.

BACKGROUND OF THE INVENTION

An operational amplifier has inherent mismatches that cause an input referred error or offset voltage. A zero differential input voltage will produce a non-zero output because of the mismatches. One solution to this problem is to auto-zero the amplifier using a sampling procedure.

An auto-zero amplifier has two separate phases, an auto-zero phase and an amplifier phase. During the auto-zero phase, the differential input voltages of the operational amplifier is held at a voltage of approximately zero and an output voltage is produced. The output voltage that is produced in the auto-zero phase is stored using capacitors. During the amplification phase, the stored offset voltage is used to correct for the offset on the input to the amplifier.

DETAILED DESCRIPTION OF THE PREFERRED EMBODIMENTS

Figure 1:
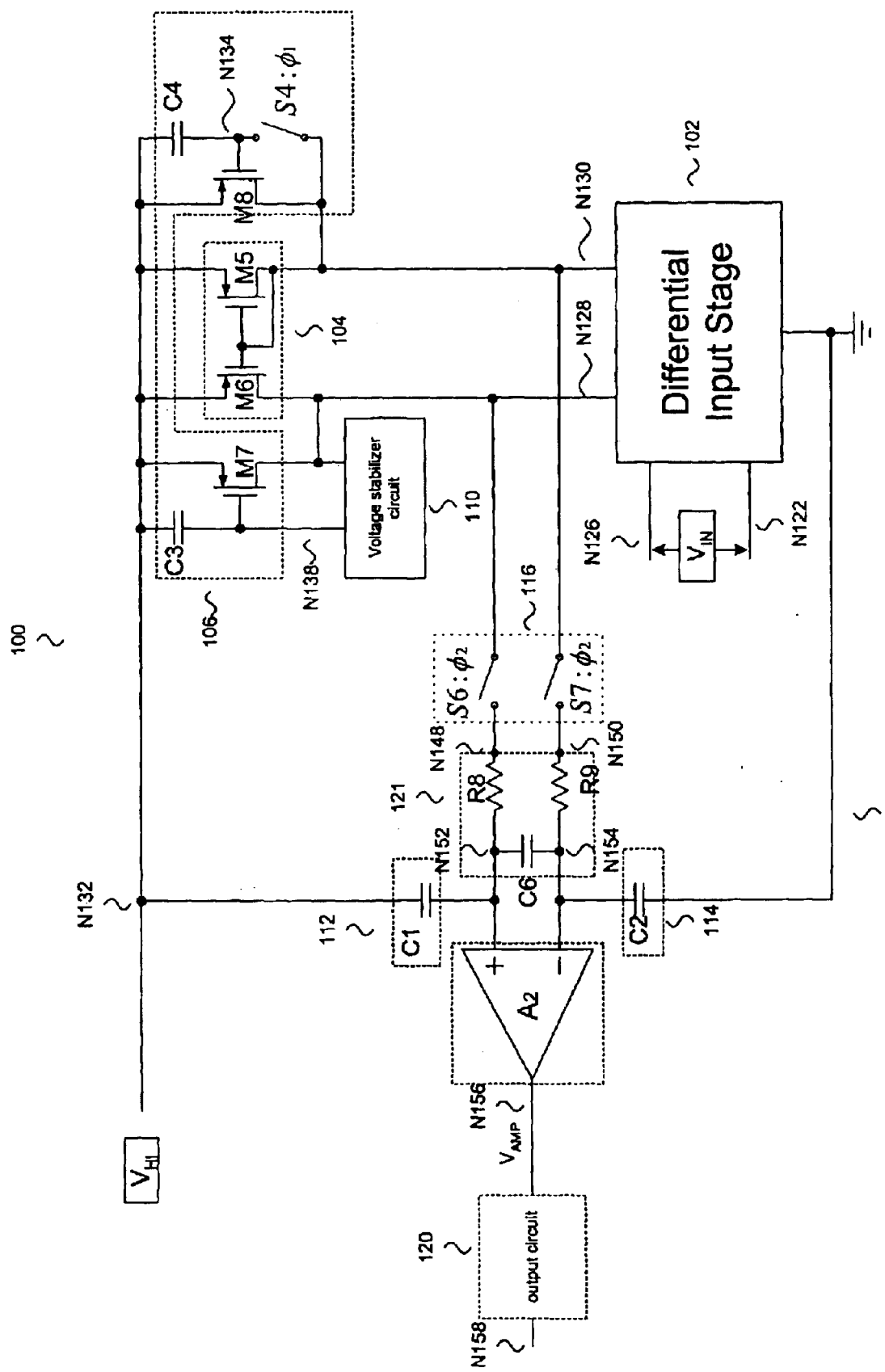
FIG. 1 illustrates a first example auto-zero amplifier circuit.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, or data signal. Referring to the drawings, like numbers indicate like parts throughout the views.

The invention is related to glitch reduction in an auto-zero amplifier. In one example, the invention is related to reduced output ripple in a reference voltage using an auto-zero amplifier with glitch reduction. The invention is further related to allowing an auto-zero amplifier to be used effectively in continuous time applications, such as voltage regulators.

FIG. 1 illustrates an example auto-zero amplifier circuit (100) that is arranged according to aspects of the present invention. Auto-zero amplifier circuit 100 includes differential input stage 102, current mirror circuit 104, differential correction circuit 106, voltage stabilizer circuit 110, capacitance circuit 112, capacitance circuit 114, switch circuit 116, amplifier circuit A2, output circuit 120, and low pass filter 121. An example capacitance circuit 112 includes capacitor C1. An example capacitance circuit 114 includes capacitor C2. An example current mirror 104 includes transistor M5 and transistor M6. An example differential correction circuit includes transistor M7, transistor M8, capacitor C3, capacitor C4, and switch S4. An example low-pass filter 121 includes resistor R8, resistor R9, and capacitor C6. An example switch circuit 116 includes switch S6 and switch S7. Although examples of capacitance circuit 112, capacitance circuit 114, current mirror 104, differential circuit 106, switch circuit 116, and low pass filter 121 are shown, other configurations of these devices that have the same functionality may be used. Low pass filter 121, output circuit 120, and amplifier A2 are optional circuits that need not be included in auto-zero amplifier 100.

Differential input stage 102 has a first port that is coupled to node N120 (which operates as a circuit ground), a first input that is coupled to node N126, a second input that is coupled to node N122, a first output that is coupled to node N128, and a second output that is coupled to node N130. Transistor M5 has a gate and a drain that are coupled to node N130, and a source that is coupled to node N132. Transistor M6 has a gate that is coupled to node N130, a drain that is coupled to node N128, and a source that is coupled to node N132. Transistor M7 has a gate that is coupled to node N138, a drain that is coupled to node N128, and a source that is coupled to node N132. Transistor M8 has a gate that is coupled to node N134, a drain that is coupled to node N130, and a source that is coupled to node N132. Voltage stabilizer circuit 110 has a first port that is coupled to node N138 and a second port that is coupled to node N128.

Capacitor C1 is coupled between node N152 and node N132. Capacitor C2 is coupled between node N120 and node N154. Capacitor C3 is coupled between node N138 and node N132. Capacitor C4 is coupled between node N134 and node N132. Capacitor C6 is coupled between node N152 and node N154. Switch S4 is coupled between node N130 and node N134. Switch S6 is coupled between node N128 and node N148. Switch S7 is coupled between node N130 and node N150. Resistor R8 is coupled between node N148 and node N152. Resistor R9 is coupled between node N150 and node N154. Amplifier circuit A2 has a first input that is coupled to node N152, a second input that is coupled to node N154, and an output that is coupled to node N156. Output circuit 120 has an input that is coupled to node N156 and an output that is coupled to node N158.

In operation, a power signal is applied to node N132, and node N120 operates as a circuit ground. An output voltage is generated by output circuit 120 at node N158 in response to a signal ($V_{AMP}$) from node N156. Differential input stage 102 is configured to receive a differential input signal (VIN) during an amplification phase. Differential input stage 102 is configured to receive an approximately zero voltage during an auto-zero phase (VIN=0V).

Auto-zero amplifier 100 operates as follows during the auto-zero phase ($\phi1$). Differential input stage 102 is configured to receive an approximately zero input (VIN=0 V) at the differential input of differential input stage 102 during the auto-zero phase. However, mismatches in differential input stage 102 and current mirror circuit 104 produce a voltage offset across nodes N128 and N130. Current mirror circuit 104 reflects approximately matched currents to nodes N128 and M130. Differential correction circuit 106 is configured to store the offset voltage during the auto-zero phase. According to the example differential correction circuit 106 illustrated in FIG. 1, capacitors C3 and C4 are configured to store the offset of the differential output of differential input stage 102 during the auto-zero phase.

Switch circuit 116 is configured to de-couple the differential output of differential input stage 102 from nodes N152 and N154 during the auto-zero phase. Capacitance circuits 112 and 114 are configured to maintain the output voltage at approximately the same voltage during the auto-zero phase as it was during the previous amplification phase.

Switch S4 is configured to close at the beginning of the auto-zero phase. Transistor M8 is configured to change from a common source configuration to a diode configuration when switch S4 closes. Transistor M8 is configured to change back to a common source configuration when switch S4 opens at the beginning of the amplification phase. Voltage stabilization circuit 110 is configured to provide a feedback path for differential correction circuit 106. Voltage stabilization circuit 110 is configured to prevent a step in voltage from occurring as a result of switch S4 opening and closing. During the auto-zero phase, voltage stabilization circuit 110 is configured to maintain a sampled voltage that was stored during the amplification stage across nodes N138 and N128. The voltage across nodes N138 and N128 is maintained so that the voltage associated with node N128 will not change substantially when transistor M8 transitions from a diode-connected configuration to a common source configuration.

Auto-zero amplifier 100 operates as follows during the amplification phase ($\phi2$). Differential input stage 102 is configured to receive an arbitrary differential input signal (which may include 0V) across the differential input of differential input stage 102 during the amplification phase. Differential correction circuit 106 is configured to maintain the same current bias state that differential correction circuit 106 had in the auto-zero phase, which corrects for the input offset. Voltage stabilization circuit 110 is configured to sample the voltage across nodes N138 and N128, and store the voltage as the sampled voltage, so the voltage associated with node N128 can be maintained during next auto-zero phase ($\phi1$). Capacitance circuits 112 and 114 are configured to serve as feedback loop compensation capacitors during the amplification phase. Amplifier circuit A2 produces signal $V_{AMP}$ at node N156.

Switch circuit 116 is configured to couple the differential output of differential input stage 102 to nodes N152 and N154 during the amplification phase. Switch circuit 116 produces charge injection at nodes N148 and N150. According to one example, switches S6 and S7 are well matched, so that the differential portion of the charge injection signal is reduced. Optional low pass filter 121 is configured to further attenuate the differential portion of the charge injection. Amplifier circuit A2 is configured to reject the common mode portion of the charge injection.

Capacitors C3 and C4 should either both have a sufficiently high capacitance to prevent significant droop, or should capacitors C3 and C4 should be well matched, so that the droop of C3 and the droop of C4 are approximately the same.

In the example shown in FIG. 1, switch circuit 116 includes two switches. In an alternative example, one of the switches may be eliminated. Charge injection is reduced when switch circuit 116 includes two switches, but two switches are not necessary for operation.

There are several applications for which auto-zero amplifier 100 can be used. In one example, auto-zero amplifier 100 is used as part of a voltage regulator circuit, and does not include output circuit 120. In another example, auto-zero amplifier 100 is a stand-alone amplifier, and output circuit 120 comprises an output gain stage. In another example, output circuit 120 is not included in auto-zero amplifier 100, and the output voltage of the auto-zero amplifier 100 is taken from the output of amplifier A2, or from nodes N152 and N154 if amplifier A2 is not included in auto-zero amplifier 100.

Although an example of auto-zero amplifier circuit 100 is shown in FIG. 1, many different configurations are possible. According to a first example, auto-zero amplifier 100 includes voltage stabilization circuit 110, but does not include amplifier circuit A2. In the first example, voltage stabilization circuit 110 is configured to accomplish glitch reduction in the output voltage. According to a second example, auto-zero amplifier 100 includes means for charge injection attenuation, but does not include voltage stabilization circuit 110. Means for charge injection attenuation may include amplifier circuit A2. Amplifier circuit A2 attenuates the common mode portion of the charge injection. Means for charge injection attenuation may also include low pass filter 121. Low pass filter 121 attenuates the differential portion of the charge injection.

In the second example, the means for charge injection attenuation is configured to accomplish glitch reduction in the output voltage. According to a third example, auto-zero amplifier 100 includes both voltage stabilization circuit 110 and means for charge injection attenuation, including amplifier A2. In the third example, voltage stabilization circuit 110 and the means for charge injection attenuation are both configured to accomplish glitch reduction in the output voltage. Glitch reduction in the output voltage reduces output ripple when auto-zero amplifier 100 is used in a voltage regulator circuit.

Figure 2:
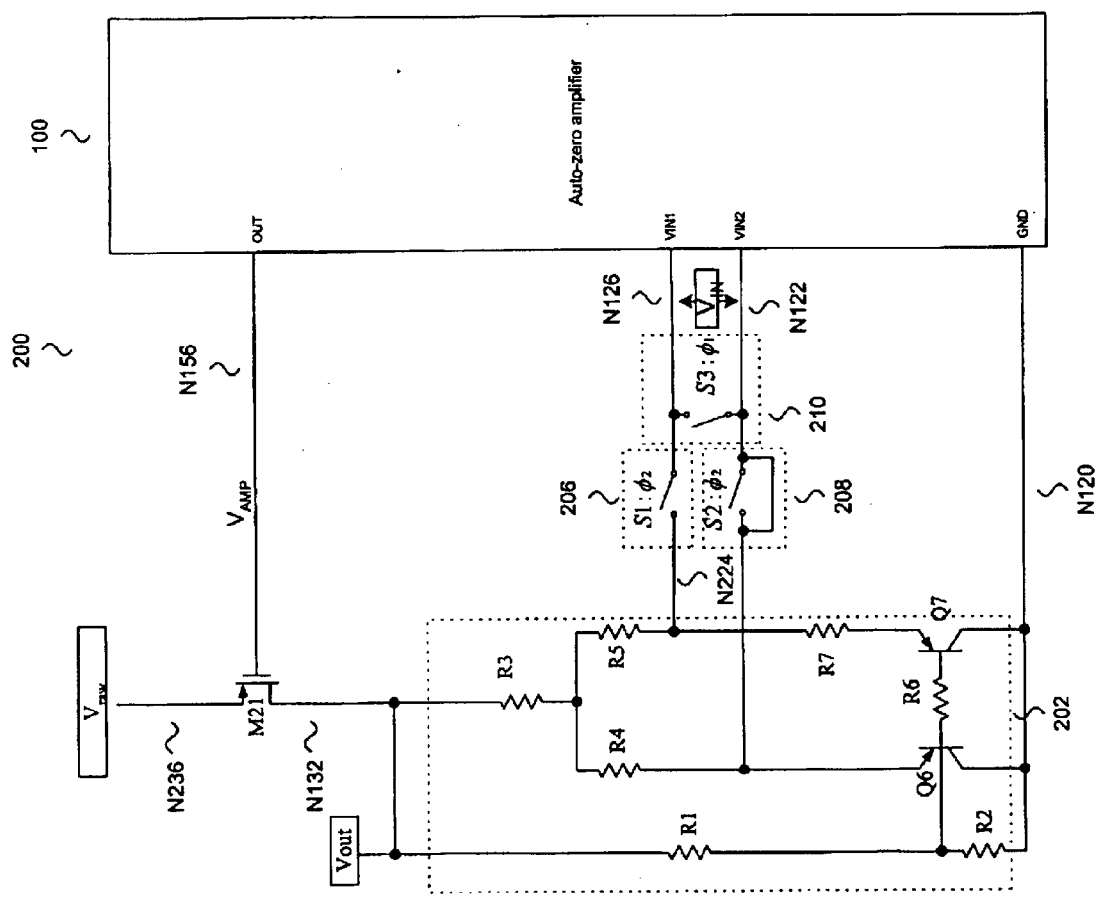
FIG. 2 illustrates a first example voltage regulator circuit that includes the example auto-zero amplifier from FIG. 1.

FIG. 2 illustrates an example voltage regulator circuit (200) that is arranged in accordance to an aspect of the present invention. Voltage regulator circuit 200 includes auto-zero amplifier 100, voltage regulator core 202, switch circuit 206, switch circuit 208, switch circuit 210, and transistor M21. Switch circuit 206 includes switch S1. Switch circuit 208 includes switch S2. Switch circuit 210 includes switch S3.

Voltage generator core 202 has a first port that is coupled to node N120, a second port that is coupled to node N132, a third port that is coupled to node N224, and a fourth port that is coupled to node N122. Switch S1 is coupled between node N224 and node N126. Switch S2 is coupled between node N122 and node N122. Switch S3 is coupled between node N126 and node N122. Transistor M21 has a gate that is coupled to node N156, a drain that is coupled to node N132, and a source that is coupled to node N236. FIG. 2 illustrates an example voltage generator core 202 that comprises a bandgap reference cell.

In operation, voltage regulator circuit 200 is configured to receive an unregulated supply signal at node N236, and node N120, where node N120 is a circuit ground. Voltage regulator circuit 200 produces a regulated supply signal (VOUT) at node N132 in response to the unregulated supply signal ($V_{raw}$).

Voltage regulator circuit 200 operates as follows during the auto-zero phase ($\phi1$). Switch S1 and switch S2 are open during φ1. S1 is configured to de-couple node N224 from the first input of differential input stage 102 during φ1. Switch S3 is configured to be closed during φ1, connecting node N126 and node N122 so that the differential input to differential input stage 102 at nodes N122 and N126 is approximately zero during the auto-zero phase (VIN=0).

Switch S3 is configured to be open during φ2, and switches S1 and S2 are configured to be closed during φ2, allowing the differential input of the auto-zero amplifier 100 to receive a voltage reference signal at nodes N122 and N224 during φ2. Voltage generator core 202 is configured to produce the voltage reference signal at nodes N122 and N126.

Transistor M21 is a series pass transistor that is configured to produce the regulated supply signal at node N132 in response to the unregulated supply signal ($V_{raw}$) and the output of differential amplifier circuit A2 ($V_{AMP}$).

In one example, switch S2 is well matched to switch S1 in order to minimize the differential charge injection.

Figure 3:
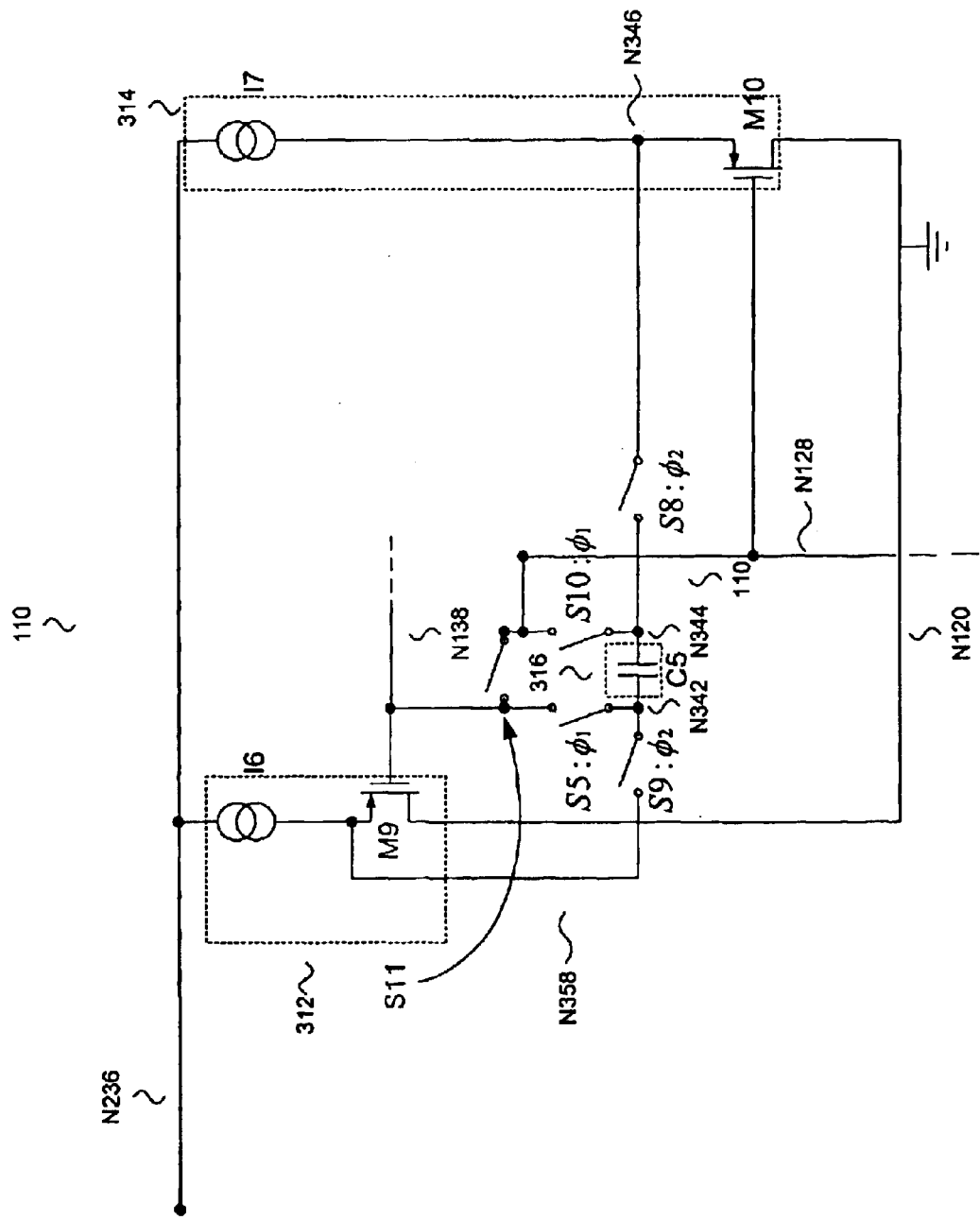
FIG. 3 illustrates an example voltage stabilization circuit.

FIG. 3 illustrates an example of voltage stabilization circuit 110, arranged in accordance to an aspect of the present invention. Voltage stabilization circuit 110 includes follower circuit 312, follower circuit 314, capacitance circuit 316, switch S5, switch S8, switch S9, switch S10, and switch S11. Capacitance circuit 316 includes capacitor C5. Follower circuit 312 includes transistor M9 and current source 16. Follower circuit 314 includes transistor M10 and current source 17.

Transistor M9 has a gate that is coupled to node N138, a drain that is coupled to node N120, and a source that is coupled to node N358. Transistor M110 has a gate that is coupled to node N128, a drain that is coupled to node N120, and a source that is coupled to node N346. Capacitor C5 is coupled between node N342 and node N344. Switch S5 is coupled between node N342 and node N138. Switch S8 is coupled between node N346 and node N344. Switch S9 is coupled between node N358 and node N342. Switch S10 is coupled between node N128 and node N344. Switch S11 is coupled between node N138 and node N128.

Voltage stabilization circuit 110 is configured to prevent a step in voltage from occurring as a result of switch S4 opening and closing. Voltage stabilization circuit 110 operates as follows during φ1. Switches S8 and S9 are configured to be open during φ1, and switches S5 and S10 are configured to be closed during φ1. The sampled voltage stored on capacitor C5 from the previous amplification phase is maintained across nodes N138 and N128 during φ1. The voltage associated with node N128 is approximately maintained in order to compensate for the large step in voltage that would otherwise occur across the differential output of differential input stage 102. Because the voltage associated with node N128 is approximately maintained at approximately the same value during φ1 that node N128 had during φ2, capacitors C3 and C4 can store the correct voltages needed cancel the input offset. The voltage associated with node N128 is approximately maintained, but it moves during the first few auto-zero cycles, until a steady operating point is reached. During φ1, there is a capacitive divider between C3 and C5 (see FIG. 1). C5 charges C3 until C3 comes to a steady operating point.

Switch S11 speeds up settling on the capacitor during the circuit start-up period. Switch S11 is closed during the first auto-zero phase (φ1). Switch S11 is closed during the first auto-zero phase so that capacitor C3 can charge up more quickly.

Voltage stabilization circuit 110 operates as follows during the amplification phase (φ2). Switches S8 and S9 are closed, and switches S5, S10, and S11 are open. Capacitor C5 is coupled between nodes N358 and N346 such that the voltage across nodes N138 and N128 is sampled through the source followers (M9 and M10). The source followers (M9 and M10) isolate the sampling nodes (N342 and N344) to minimize loss due to capacitive loading on nodes N128 and N138.

In one example, switch S11 is configured to be closed during every auto-zero phase. In another example, switch S 11 is configured to be closed during the first few auto-zero phases. In another example, switch S11 is closed during the first auto-zero phase only, and S11 is configured to close during the first auto-zero phase in response to an output signal of a one-shot timer (not shown). Switch S11 is closed during the first auto-zero phase so that capacitor C3 can charge up more quickly. Switch S11 is not necessary for proper operation of voltage regulator circuit 200, but switch S11 is configured to initialize the voltage on capacitor C3 for faster start-up in one example.

In FIG. 3, follower circuit 312 and follower circuit 314 is shows as coupled to node N236, which is configured to receive a power signal (e.g., $V_{raw}$ in FIG. 1). Alternative, follower circuit 312 and follower circuit 314 may be coupled to another power signal such as node N136, which corresponds to $V_{HI}$ in FIG. 1.

Figure 4:
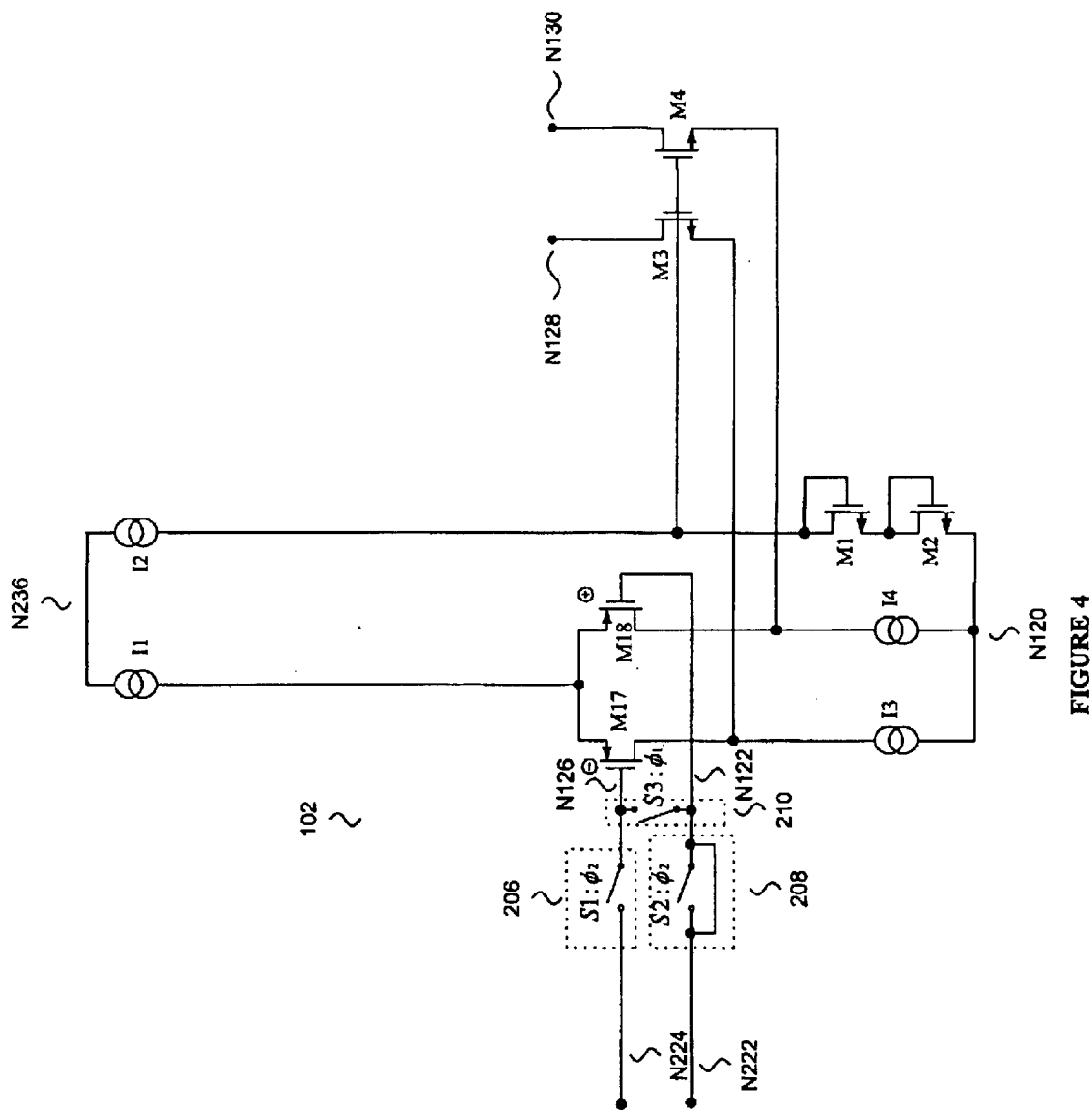
FIG. 4 illustrates an example differential input stage for use in the example voltage regulator of FIG. 2.

FIG. 4 illustrates an example of differential input stage 102. FIG. 4 shows an example of differential input stage 102 in which the differential input stage is part of a folded cascode amplifier.

Figure 5:
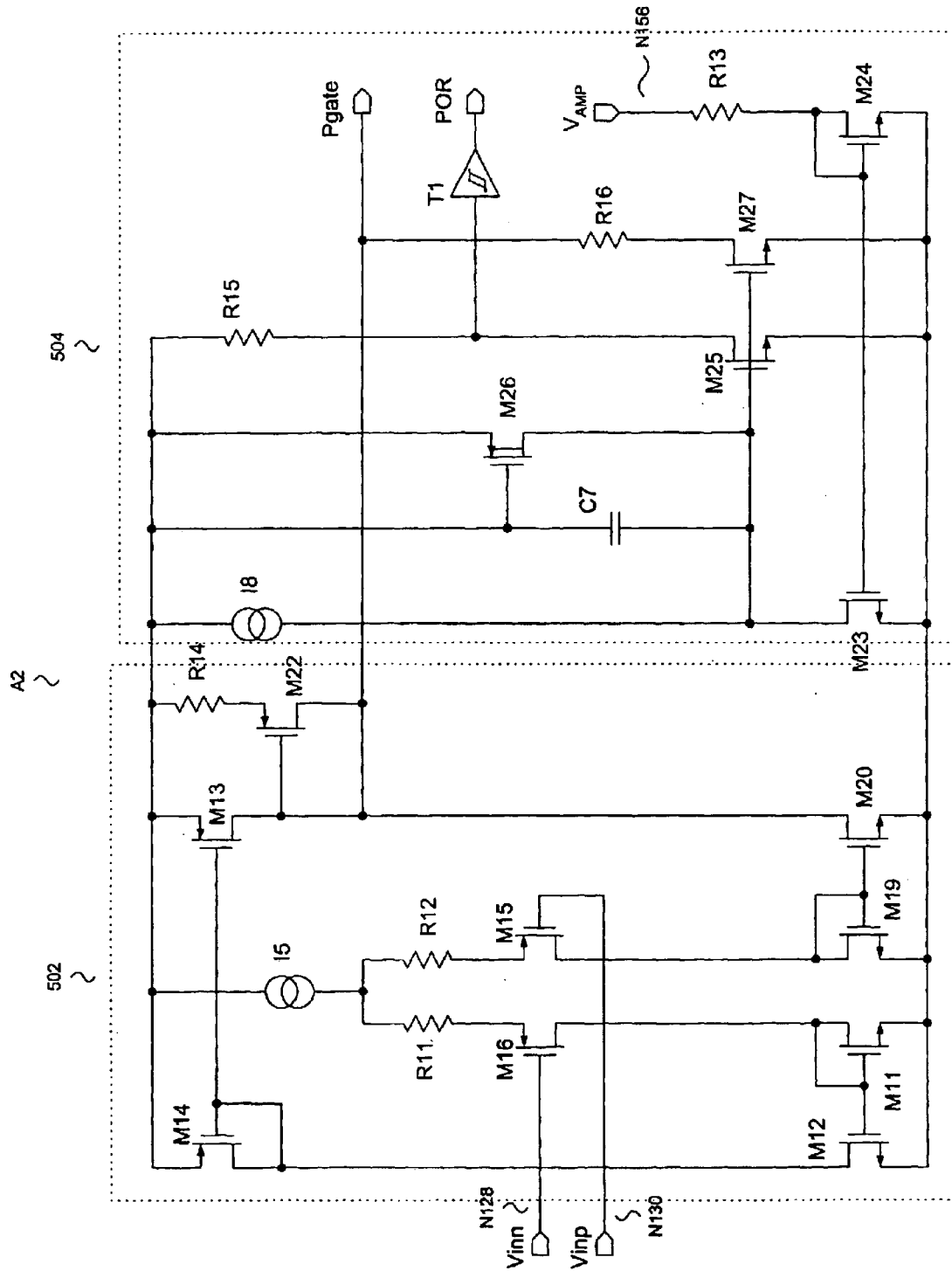
FIG. 5 illustrates an example differential amplifier for use in the example auto-zero amplifier of FIG. 1.

An example of differential amplifier circuit A2 is illustrated in FIG. 5. Differential amplifier circuit A2 includes gain stage 502 and start-up circuit 504. Gain stage 502 is an output transconductance amplifier that is source-degenerated. Start-up circuit 504 is configured to produce signal $V_{AMP}$ at node N156 and to generate a power on reset [POR] signal.

Figure 6:
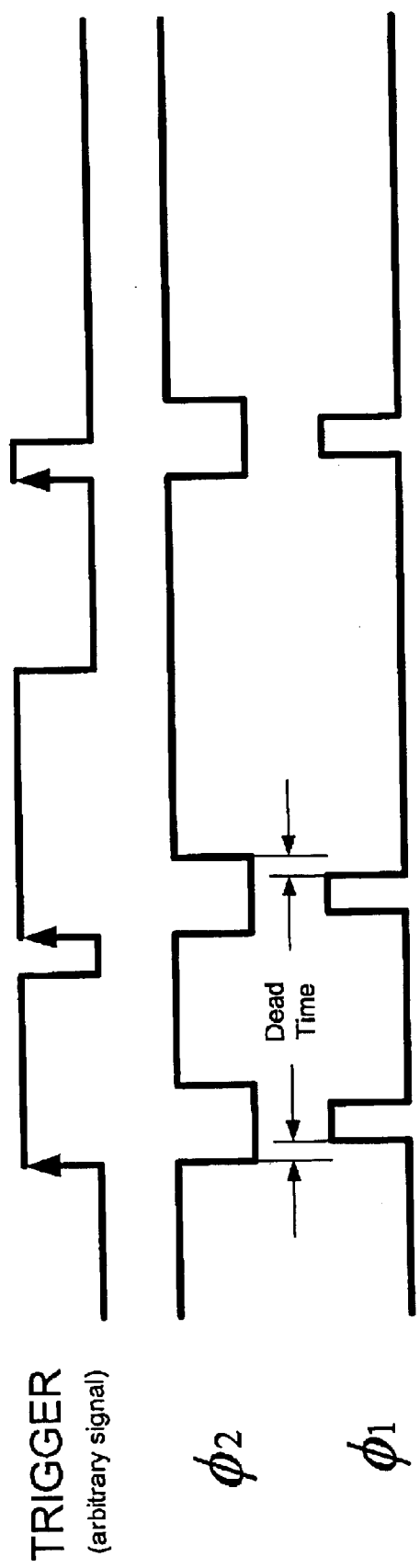
FIG. 6 illustrates an example timing diagram for the voltage regulator of FIG. 2.

FIG. 6 is an example timing diagram for voltage regulator circuit 200. FIG. 6 illustrates the timing of the signals used to for the switches in regulator circuit 200, according to one example. Trigger is an arbitrary signal used to trigger a new auto-zero phase. Trigger may be a clock signal, but may also be any digital signal that is used to trigger new auto-zero phases. A rising edge on the trigger signal during the amplification phase indicates that a new auto-zero phase should begin. (In the example of FIG. 6, the auto-zero cycle is initiated on a rising edge. This is arbitrary. It may just as well be triggered on the falling edge, depending on the design of the sequencer.) A rising edge on the trigger does not affect the other signals during the auto-zero phase.

Signal Φ1 is high during the auto-zero phase, and signal Φ2 is high during the amplification phase. Signal Φ2 transitions from high to low when trigger undergoes a low to high transition and signal Φ2 is high. Signal Φ1 remains low for a certain dead time after signal Φ2 transitions low. This is a break-before-make scheme that prevents all switches from being active simultaneously. After the duration of the dead time has passed, signal Φ1 transitions high. Signal Φ1 remains high for the duration of the auto-zero phase, and then transitions low. After signal Φ1 transitions low, a second dead time occurs in which signal Φ2 remains low. After the duration of the second dead time passes, signal Φ2 transitions high. The second dead time also prevents all switches from being active simultaneously.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An auto-zero amplifier circuit, comprising:
   a differential input stage having a first input, a second input, a first output and a second output, wherein the inputs of the differential input stage are substantially the same during an auto-zero phase;
   a current mirror circuit having a first port that is coupled to the first output of the differential input stage, and a second port that is coupled to the second output of the differential input stage;
   a differential correction circuit having a first port, a second port, and a third port, wherein the first port of the differential correction circuit is coupled to the first port of the current mirror circuit, the third port of the differential correction circuit is coupled to the second port of the current mirror circuit;
   a voltage stabilizer circuit having a first port that is coupled to the second port of the differential correction circuit and a second port that is coupled to the first port of the differential correction circuit;
   a first switch circuit comprising a first switch that is coupled between a first node and the first output of the differential input stage, wherein the first switch circuit is closed during an amplification phase and open during the auto-zero phase;
   a first capacitance circuit that is coupled to the first node; and
   a second capacitance circuit that is coupled to a second node.

2. The auto-zero amplifier circuit as in claim 1, wherein the differential input stage is configured to provide a differential output signal across the first and second output of the differential input stage, and the differential correction circuit is configured to store a signal that is associated with the first port of the current mirror circuit and the second port of the current mirror circuit during the auto-zero phase, and further configured to approximately maintain a biasing state of the auto-zero amplifier during the amplification phase such that an input offset is approximately nullified.

3. The auto-zero amplifier circuit as in claim 1, wherein the voltage stabilizer circuit is configured to sample a voltage across the first and second ports of the differential correction circuit during the amplification phase, and is further configured to maintain the voltage across the first and second ports of the differential correction circuit during the auto-zero phase.

4. The auto-zero amplifier circuit as in claim 1, the first switch circuit further comprising a second switch that is coupled between the second node and the second output of the differential input stage, wherein the second switch is closed during the amplification phase and open during the auto-zero phase.

5. The auto-zero amplifier circuit as in claim 1, wherein the differential input stage comprises a portion of a folded cascode amplifier.

6. The auto-zero amplifier circuit as in claim 1, further comprising an amplifier circuit having a first input that is coupled to the first node, a second input that is coupled to the second node, and an output.

7. The auto-zero amplifier circuit as in claim 4, further comprising an amplifier circuit having a first input that is coupled to the first node, a second input that is coupled to the second node, and an output.

8. The auto-zero amplifier circuit as in claim 7, wherein the amplifier circuit is configured to receive a differential input signal across the first and second inputs of the amplifier circuit, and wherein the amplifier circuit is configured to reject the common mode portions of charge injection of the differential input signal.

9. The auto-zero amplifier circuit as in claim 6, further comprising an output gain stage having an input that is coupled to the output of the amplifier circuit.

10. The auto-zero amplifier circuit as in claim 1, wherein:
    the first capacitance circuit comprises a first capacitor;
    the second capacitance circuit comprises a second capacitor; and
    the differential correction circuit comprises:
        a first transistor having a drain that is coupled to the first output of the differential input stage;
        a third capacitor coupled between a source of the first transistor and a gate of the first transistor;
        a second transistor having a drain that is coupled to the second output of the differential input stage;
        a fourth capacitor that is coupled between s source of the second transistor and a gate of the second transistor; and
        a third switch that is coupled between the gate of the second transistor and the drain of the second transistor, wherein the third switch is closed during the auto-zero phase.

11. The auto-zero amplifier as in claim 1, the voltage stabilization circuit comprising:
    a fifth capacitor that is coupled between a third node and a fourth node;
    a first follower circuit having an input that is coupled to the gate of the first transistor and an output that is coupled to a fifth node;
    a second follower circuit having an input that is coupled to the drain of the first transistor and an output that is coupled to a sixth node;
    a fourth switch that is coupled between the gate of the first transistor and the third node;
    a fifth switch that is coupled between the drain of the first transistor and the fourth node, wherein the fifth switch is closed during the auto-zero phase;
    a sixth switch that is coupled between the fifth node and the third node, wherein the sixth switch is closed during the amplification phase; and
    a seventh switch that is coupled between the sixth node and the fourth node, wherein the seventh switch is closed during the amplification phase.

12. The auto-zero amplifier circuit as in claim 1, further comprising an eighth switch that is coupled between the first and second inputs of the differential input stage, wherein the eighth switch is closed during the auto-zero phase.

13. The auto-zero amplifier circuit as in claim 1, further comprising a ninth switch that is coupled between the first input of the differential input stage and a third node, wherein the third node is configured to receive an input signal.

14. A voltage regulator circuit having an auto-zero amplifier circuit comprising:
    a differential input stage having a first input, a second input, a first output and a second output, wherein the inputs of the differential input stage are substantially the same during an auto-zero phase;
    a current mirror circuit having a first port that is coupled to the first output of the differential input stage, and a second port that is coupled to the second output of the differential input stage;

a differential correction circuit having a first port, a second port, and a third port, wherein the first port of the differential correction circuit is coupled to the first port of the current mirror circuit, the third port of the differential correction circuit is coupled to the second port of the current mirror circuit;

a voltage stabilizer circuit having a first port that is coupled to the second port of the differential correction circuit and a second port that is coupled to the first port of the differential correction circuit;

a first switch circuit comprising a first switch that is coupled between a first node and the first output of the differential input stage, wherein the first switch circuit is closed during an amplification phase and open during the auto-zero phase;

a first capacitance circuit that is coupled to the first node;

a second capacitance circuit that is coupled to a second node;

a voltage generator core having a first output and a second output, wherein the second output of the voltage generator is coupled to the second input of the differential input stage;

a second switch circuit that is coupled between the first output of the voltage generator and the first input of the differential input stage, wherein the second switch circuit is configured to close during the amplification phase; and a third switch circuit that is coupled between the first input of the differential input stage and the second input of the differential input stage, wherein the third switch circuit is configured to close during the auto-zero phase.

15. The voltage regulator circuit as in claim 14, wherein the voltage generator core comprises a band gap reference cell.

16. The voltage regulator as in claim 14, further comprising: an amplifier circuit having a first input that is coupled to the first node, a second input that is coupled to the second node, and an output, wherein the amplifier circuit is configured to receive a differential input signal at the first and second inputs of the amplifier circuit, and the amplifier circuit is configured to reject the common mode portion of the differential input signal.

17. The voltage regulator circuit as in claim 16, further comprising an output circuit, the output circuit comprising a series pass transistor having a gate that is coupled to the output of the amplifier circuit, a source that is coupled to the unregulated supply signal, and a drain that is configured to provide the regulated supply signal in response to the output of the amplifier circuit.

18. An auto-zero amplifier circuit, wherein the auto-zero amplifier circuit is configured to produce an output signal, the auto-zero amplifier circuit comprising:

a means for producing that is configured to produce a first differential output signal across a first output and a second output;

a differential correction means that is configured to sample first differential output signal during an auto-zero phase, wherein the differential correction means further configured to maintain a biasing condition across the first and second outputs during an amplification phase;

a first means for de-coupling that is configured to de-couple the means for producing from a first node during the auto-zero phase;

a first means for storing that is configured to hold the voltage at the first node during the auto-zero phase; and a means for glitch reduction that is configured to reduce glitches in the output signal.

19. The auto-zero amplifier circuit as in claim 18, the means for glitch reduction comprising: a means for voltage stabilization that is configured to sample a first voltage at the first output during amplification phase, and approximately maintain the first voltage at the first output during the auto-zero phase.

20. The auto-zero amplifier circuit as in claim 18, the auto-zero amplifier circuit further comprising a second means for de-coupling that is configured to de-couple the means for producing from a second node, and the means for glitch reduction comprising a means for charge injection attenuation that is configured to attenuate the charge injection that is produced by the first and second means for de-coupling.

* * * * *

UNITED STATES PATENT AND TRADEMARK OFFICE
CERTIFICATE OF CORRECTION

PATENT NO.    : 6,781,450 B1
DATED         : August 24, 2004
INVENTOR(S)   : Mark J. Mercer et al.

It is certified that error appears in the above-identified patent and that said Letters Patent is hereby corrected as shown below:

Column 1,
Lines 42-44, delete "EMBODIMENTS" and insert -- EMBODIMENT --.

Column 5,
Line 30, delete "M110" and insert -- M10 --.

Signed and Sealed this

Fifteenth Day of February, 2005

JON W. DUDAS
*Director of the United States Patent and Trademark Office*